United States Patent
Cho et al.

(10) Patent No.: US 11,623,175 B1
(45) Date of Patent: Apr. 11, 2023

(54) APPARATUS FOR TRAPPING OF REACTION BY-PRODUCT HAVING SELF REGENERATING FUNCTION FOR USED INNER COLLECTING TOWER

(71) Applicant: MILAEBO CO., LTD., Pyeongtaek-si (KR)

(72) Inventors: Che Hoo Cho, Seoul (KR); In Mun Hwang, Hwaseong-si (KR); In Hwan Kim, Osan-si (KR); Jun Min Lee, Osan-si (KR)

(73) Assignee: MILAEBO CO., LTD., Pyeongtaek-si (KR)

( * ) Notice: Subject to any disclaimer, the term of this patent is extended or adjusted under 35 U.S.C. 154(b) by 0 days.

(21) Appl. No.: 17/698,999

(22) Filed: Mar. 18, 2022

(30) Foreign Application Priority Data

Dec. 13, 2021 (KR) .......................... 10-2021-0177718

(51) Int. Cl.
*B01D 53/00* (2006.01)
*B01D 53/96* (2006.01)

(52) U.S. Cl.
CPC ........... *B01D 53/005* (2013.01); *B01D 53/96* (2013.01); *B01D 2257/60* (2013.01); *B01D 2258/0216* (2013.01)

(58) Field of Classification Search
CPC ................. B01D 53/005; B01D 53/96; B01D 2258/0216; B01D 2257/60; B01J 19/00; B01J 19/002; B01J 2219/00; B01J 2219/00247; B01J 2219/00252; B01J 2219/00495; B01J 2219/0099
See application file for complete search history.

(56) References Cited

U.S. PATENT DOCUMENTS

2022/0111324 A1\* 4/2022 Iyer .................... B01D 46/0086

FOREIGN PATENT DOCUMENTS

| JP | 2008-098283 A | 4/2008 |
|---|---|---|
| KR | 10-0311145 B1 | 11/2001 |
| KR | 10-0564272 B1 | 3/2006 |
| KR | 10-0631924 B1 | 10/2006 |
| KR | 10-2019-0078939 A | 7/2019 |
| KR | 10-2209205 B1 | 2/2021 |

\* cited by examiner

*Primary Examiner* — Timothy C Vanoy
(74) *Attorney, Agent, or Firm* — Rabin & Berdo, P.C.

(57) ABSTRACT

The present disclosure provides an apparatus for trapping of a reaction by-product having a self regenerating function for a used inner collecting tower, and an object of the present disclosure is to provide the reaction by-product trapping apparatus configured such that the trapping apparatus positioned between a process chamber and a vacuum pump or between the vacuum pump and a scrubber stops operating during a semiconductor manufacturing process when a trapping reaction of trapping a reaction by-product reaches a saturated state during a trapping operation, and the trapping apparatus removes the reaction by-product produced in an inner collecting tower through a heating reaction, such that the inner collecting tower is regenerated to enable an additional trapping reaction to be performed.

17 Claims, 9 Drawing Sheets

APPARATUS FOR TRAPPING OF REACTION BY-PRODUCT HAVING SELF REGENERATING FUNCTION FOR USED INNER COLLECTING TOWER

CROSS-REFERENCE TO RELATED APPLICATIONS

This application claims the priority of Korean Patent Application No. 10-2021-0177718 filed on Dec. 13, 2021, in the Korean Intellectual Property Office, the disclosure of which is incorporated herein by reference.

BACKGROUND

Field

The present disclosure relates to an apparatus for trapping of a reaction by-product having a self regenerating function for a used inner collecting tower, and more particularly, to a technology for increasing use duration time of a trapping apparatus by regenerating the trapping apparatus into a state of being capable of trapping a reaction by-product again by removing a reaction by-product trapped while the trapping apparatus performs a trapping operation during a semiconductor manufacturing process.

Description of the Related Art

In general, a semiconductor manufacturing process is broadly divided into a front-end process (fabrication process) and a back-end process (assembly process). The front-end process refers to a process of manufacturing semiconductor chips by processing specific patterns by repeatedly performing a procedure of depositing thin films on wafers in various types of process chambers and a procedure of selectively etching the deposited thin films. The back-end process refers to a process of individually separating the chips manufactured in the front-end process and then assembling finished products by combining the chips and lead frames.

In this case, the process of depositing the thin film on the wafer or etching the thin film deposited on the wafer is performed at a high temperature by injecting necessary process gases such as a precursor gas for depositing the thin film and injecting etching gases into a process chamber through a gas injection system. In this case, various types of reaction by-products, which are not used for deposition, unreacted ignitable gases, and harmful gases containing corrosive foreign substances and toxic substance are produced in large amount in the process chamber, and the resultant products are discharged as exhaust gases.

Therefore, in a semiconductor manufacturing facility, a reaction by-product trapping apparatus is installed between the process chamber and a vacuum pump in order to trap a reaction by-product contained in exhaust gases discharged from the process chamber. The reaction by-product trapping apparatus traps the reaction by-product contained in the exhaust gases, and then a scrubber positioned at a rear end of the vacuum pump finally purifies the non-reacted gases and then discharges the non-reacted gases into the atmosphere.

Meanwhile, when the reaction by-product trapping apparatus traps the reaction by-products in an inner collecting tower for use duration time, the reaction by-products are attached to or accumulated on an internal space of a housing or a trapping plate of the inner collecting tower, such that the reaction by-product trapping process cannot be performed any further. For this reason, the reaction by-product trapping apparatus is replaced with a new apparatus or a trapping apparatus regenerated by cleaning the inner collecting tower and the interior of the housing of the reaction by-product trapping apparatus in order to perform a semiconductor manufacturing process.

The process of replacing the trapping apparatus disadvantageously delays the semiconductor manufacturing process or increases manufacturing costs.

Accordingly, there is a need for a technology capable of increasing the use duration time of the trapping apparatus, but this technology has not been proposed up to now.

DOCUMENTS OF RELATED ART

Patent Documents (Patent Document 1) Korean Patent No. 10-0311145 (registered on Sep. 24, 2001)
(Patent Document 2) Korean Patent No. 10-0564272 (registered on Mar. 20, 2006)
(Patent Document 3) Korean Patent No. 10-0631924 (registered on Sep. 27, 2006)
(Patent Document 4) Korean Patent No. 10-2209205 (registered on Jan. 25, 2021)

SUMMARY

An object to be achieved by the present disclosure is to provide a reaction by-product trapping apparatus configured such that the trapping apparatus positioned between a process chamber and a vacuum pump or between the vacuum pump and a scrubber stops operating during a semiconductor manufacturing process when a trapping reaction of trapping a reaction by-product reaches a saturated state or a cycle for performing dry cleaning on the process chamber during a trapping operation, and the trapping apparatus removes the reaction by-product produced in an inner collecting tower through a heating reaction, such that the inner collecting tower is regenerated to enable an additional trapping reaction to be performed.

According to an aspect, the present disclosure provides an apparatus for trapping of a reaction by-product having a self regenerating function for a used inner collecting tower, which is installed between a process chamber and a vacuum pump or between the vacuum pump and a scrubber during a semiconductor manufacturing process, the reaction by-product trapping apparatus including: a heater configured to heat exhaust gas introduced into a housing to trap and discharge a reaction by-product contained in the exhaust gas discharged after a deposition process; an inner collecting tower configured to trap the reaction by-product from the exhaust gas introduced into the housing; and regeneration heaters installed on the inner collecting tower and configured to remove the reaction by-product through a heating reaction, in which spaces inside and outside the inner collecting tower are ensured so that an additional trapping reaction occurs.

In the exemplary embodiment, the regeneration heaters may be installed alternately in a zigzag manner on the inner collecting tower so that thermal conduction is implemented.

In the exemplary embodiment, the regeneration heaters may include: an outer regeneration heater installed to be in contact with or adjacent to an outer portion of the inner collecting tower; and an inner regeneration heater installed in an internal space of the inner collecting tower.

In the exemplary embodiment, the single outer regeneration heater may be provided, or the outer regeneration heater may be divided into two or more pieces to surround the outer portion of the inner collecting tower.

In the exemplary embodiment, the single inner regeneration heaters may be provided, or the inner regeneration heater may be divided into two or more pieces to surround the outer portion of the inner collecting tower.

In the exemplary embodiment, the reaction by-product trapping apparatus may be a trapping apparatus configured to trap the reaction by-product contained in the exhaust gas produced during a TiN deposition process using $TiCl_4$ and $NH_3$ gases in the process chamber, the reaction by-product trapping apparatus may trap the reaction by-product in the exhaust gas by using the inner collecting tower by heating an internal space of the housing to a temperature within a temperature region of 120° C. or lower by using the heater, and the reaction by-product trapping apparatus may ensure an additional trapping reaction space through a regeneration operation of removing the reaction by-product inside and outside the inner collecting tower by heating the regeneration heater to 400° C. or higher when the trapping reaction is ended.

In the exemplary embodiment, the inner collecting tower may include: an upper-end trapping unit configured to perform the trapping reaction while guiding a flow of the exhaust gas, which is distributed and descending to an outer periphery by the heater, to a central portion; an intermediate trapping unit configured to perform the trapping reaction while guiding the flow of the descending exhaust gas to the outer periphery and having the regeneration heaters to remove the reaction by-product; and a lower-end trapping unit configured to perform the trapping reaction while guiding the exhaust gas descending to the outer periphery to a gas discharge port at the central portion.

In the exemplary embodiment, the upper-end trapping unit may have a flat plate shape, a main flow hole may be formed in a central portion of the upper-end trapping unit, a plurality of auxiliary flow holes may be formed to be circularly arranged at the periphery of the main flow hole, triangular plates for inducing an exhaust gas flow and cross-shaped plates for generating vortices may be circularly arranged at the periphery of an upper surface of the upper-end trapping unit, and quadrangular plates may be circularly arranged on a lower surface of the upper-end trapping unit to induce a uniform downward flow of the exhaust gas descending through the main flow hole and the auxiliary flow holes.

In the exemplary embodiment, the upper-end trapping unit may be installed to be spaced apart from the intermediate trapping unit at a predetermined height by a support unit and spacers installed on a lower portion of the upper-end trapping unit and having a predetermined length.

In the exemplary embodiment, the intermediate trapping unit may include a plurality of vertical trapping plates arranged to be spaced apart from one another at predetermined intervals, regeneration heater through-holes may be formed in the vertical trapping plates and penetrated by the regeneration heaters, and regeneration heater fixing units may be installed to connect the adjacent vertical trapping plates and fix the regeneration heaters.

In the exemplary embodiment, the intermediate trapping unit may include vertical trapping plates installed in an internal space thereof, and the vertical trapping plates may each have a relatively smaller size than each of a plurality of vertical trapping plates arranged to be spaced apart from one another at predetermined intervals along the periphery of the intermediate trapping unit, such that thermal conduction is implemented from the regeneration heaters.

In the exemplary embodiment, the intermediate trapping unit may include an outer peripheral trapping plate part, an intermediate trapping plate part, and an inner trapping plate part, which are configured as multiple plate parts and each have flow holes formed in a surface thereof, the intermediate trapping unit may be configured to perform the trapping reaction while guiding the exhaust gas inward from the outer periphery and blocking an inflow of the exhaust gas from above so that the exhaust gas does not flow directly into the gas discharge port, the intermediate trapping unit may be fastened to supports installed on a lower plate of the housing, and the supports may be configured to support an overall load of the intermediate trapping unit in a state in which the intermediate trapping unit is spaced apart from the lower plate of the housing.

In the exemplary embodiment, the outer peripheral trapping plate part may have a structure opened at a lower side thereof and include an upper trapping plate and lateral trapping plates each having a plurality of flow holes, and a plurality of vortex generating pieces may be arranged and installed at an inclination angle on an outer portion of the outer peripheral trapping plate part.

In the exemplary embodiment, the intermediate trapping plate part may have a structure opened at a lower side thereof and spaced apart from an upper surface of the outer peripheral trapping plate part at a predetermined interval by spacers, and the intermediate trapping plate part may include an upper trapping plate having a closed structure, and lateral trapping plates having a plurality of flow holes.

In the exemplary embodiment, the inner trapping plate part may have a structure opened at upper and lower sides thereof and is fixed to the intermediate trapping plate part, and the inner trapping plate part may include lateral trapping plates having a plurality of flow holes.

According to the apparatus for trapping of a reaction by-product having a self regenerating function for a used inner collecting tower according to the present disclosure characterized as described above, the trapping apparatus positioned between the process chamber and the vacuum pump or between the vacuum pump and the scrubber stops operating during a semiconductor manufacturing process when the trapping reaction of trapping the reaction by-product reaches a saturated state or a cycle for performing dry cleaning on the process chamber during the trapping operation, and the trapping apparatus removes the reaction by-products formed on the trapping plates of the inner collecting tower and the region at the periphery of thereof and the reaction by-products formed in the internal spaces of the trapping plates through the heating reaction by the regeneration heater, thereby regenerating the inner collecting tower.

In addition, according to the present disclosure, the inner collecting tower may be regenerated without being replaced during the trapping operation, and an additional trapping reaction may be performed by the inner collecting tower, such that the use duration time may be extended without replacing or cleaning the reaction by-product trapping apparatus. Therefore, it is possible to improve overall semiconductor manufacturing efficiency and reduce manufacturing costs.

The present disclosure is a useful invention having many advantages as described above and is an invention that is highly expected to be used in industries.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE EMBODIMENT

Hereinafter, configurations and operations of embodiments of the present disclosure will be described in detail with reference to the accompanying drawings. In addition, in the description of the present disclosure, the specific descriptions of related well-known functions or configurations will be omitted when it is determined that the specific descriptions may unnecessarily obscure the subject matter of the present disclosure.

Figure 1:
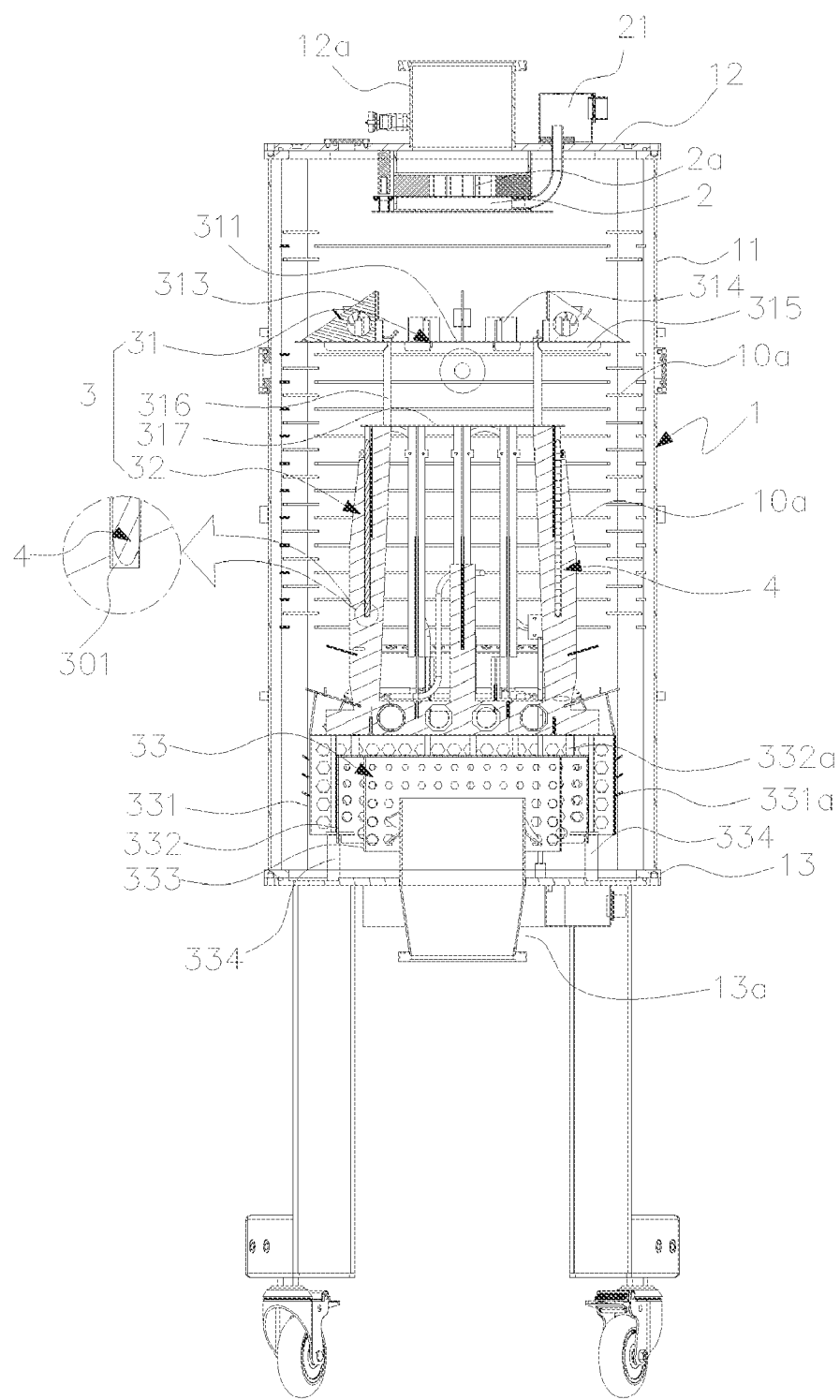
FIG. 1 is a cross-sectional view illustrating a configuration of a reaction by-product trapping apparatus having a regeneration heater according to an embodiment of the present disclosure.
Figure 2:
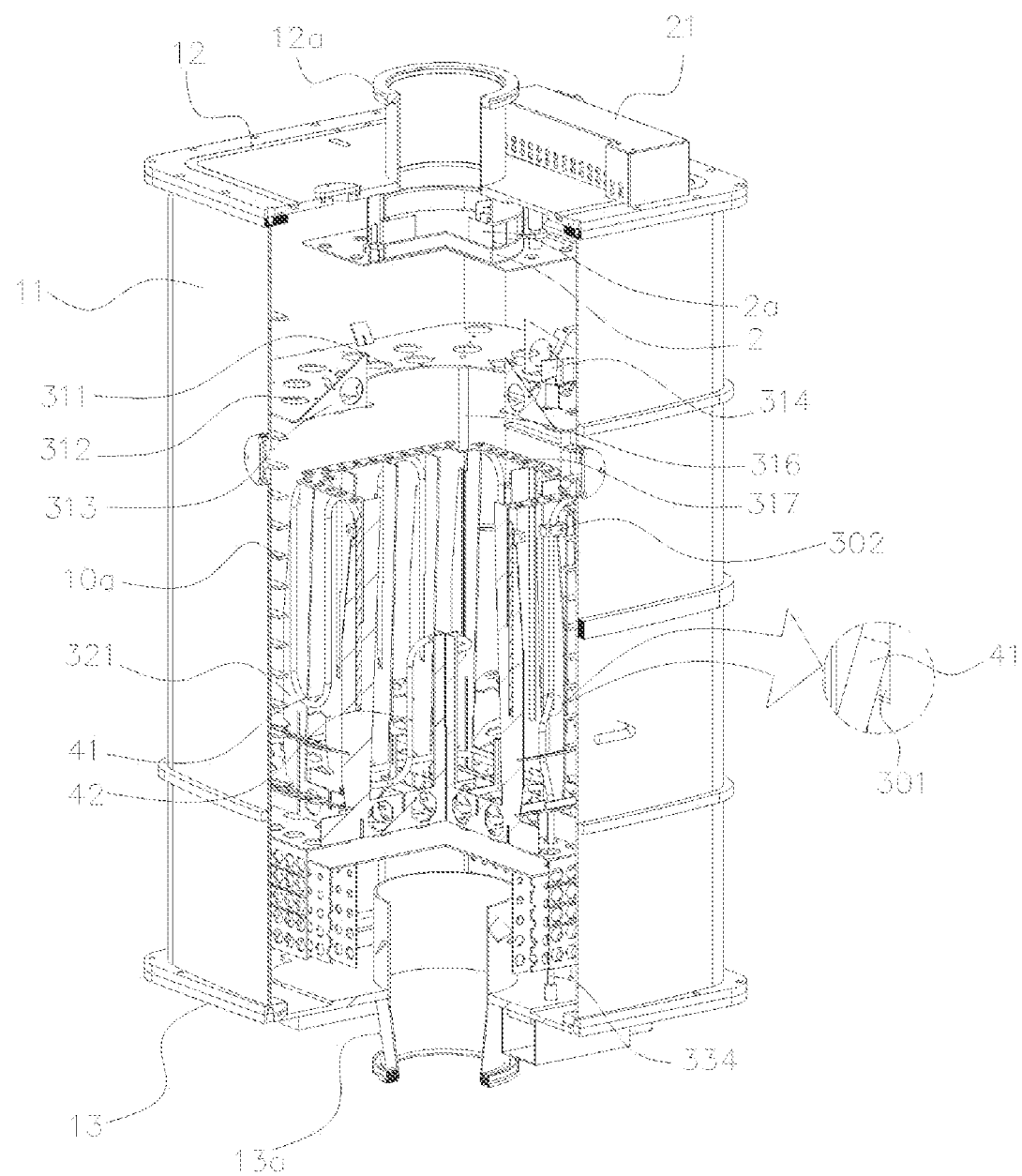
FIGS. 2 and 3 are perspective views illustrating an interior of the reaction by-product trapping apparatus having the regeneration heater according to the embodiment of the present disclosure.
Figure 3:
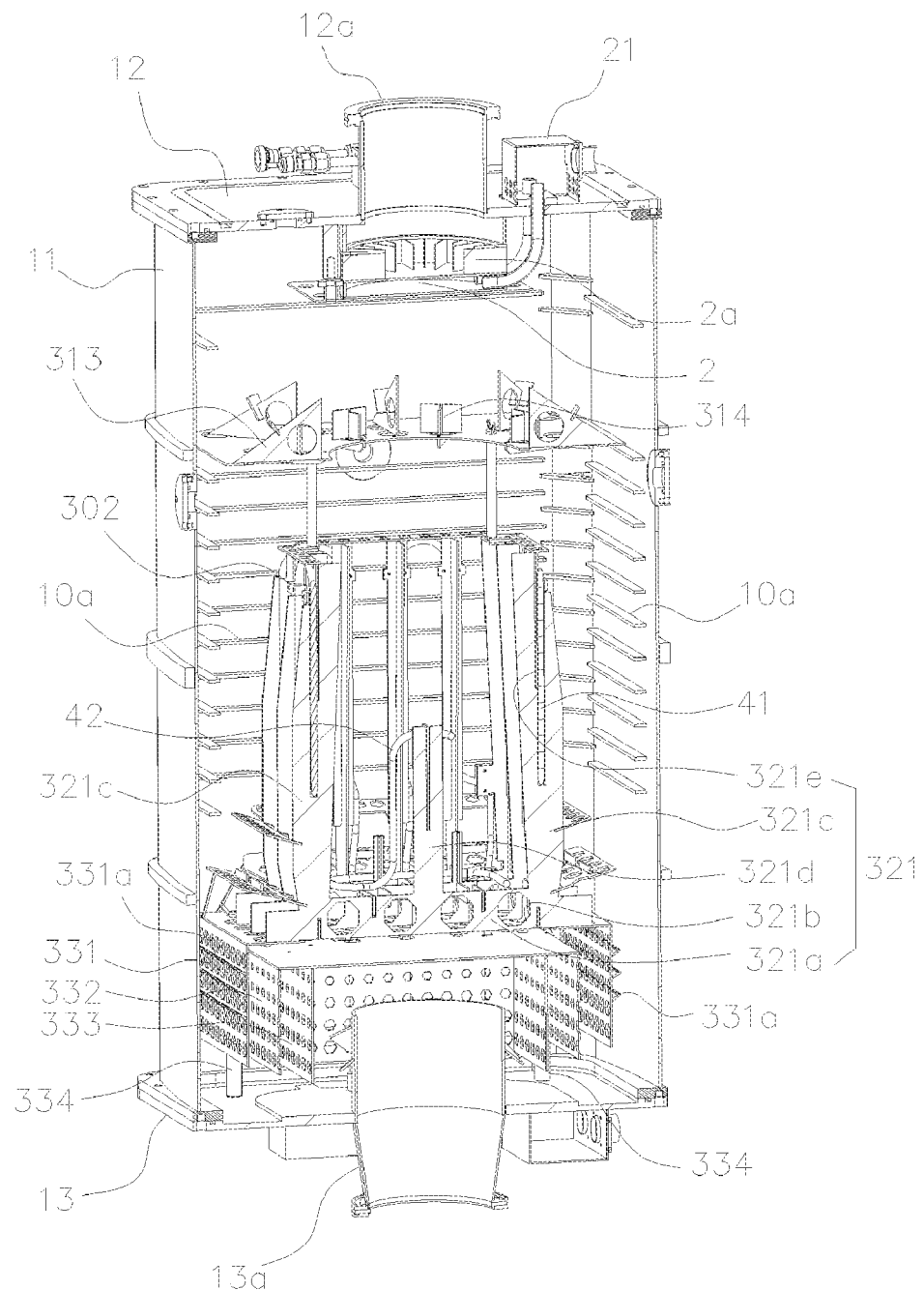
Figure 4:
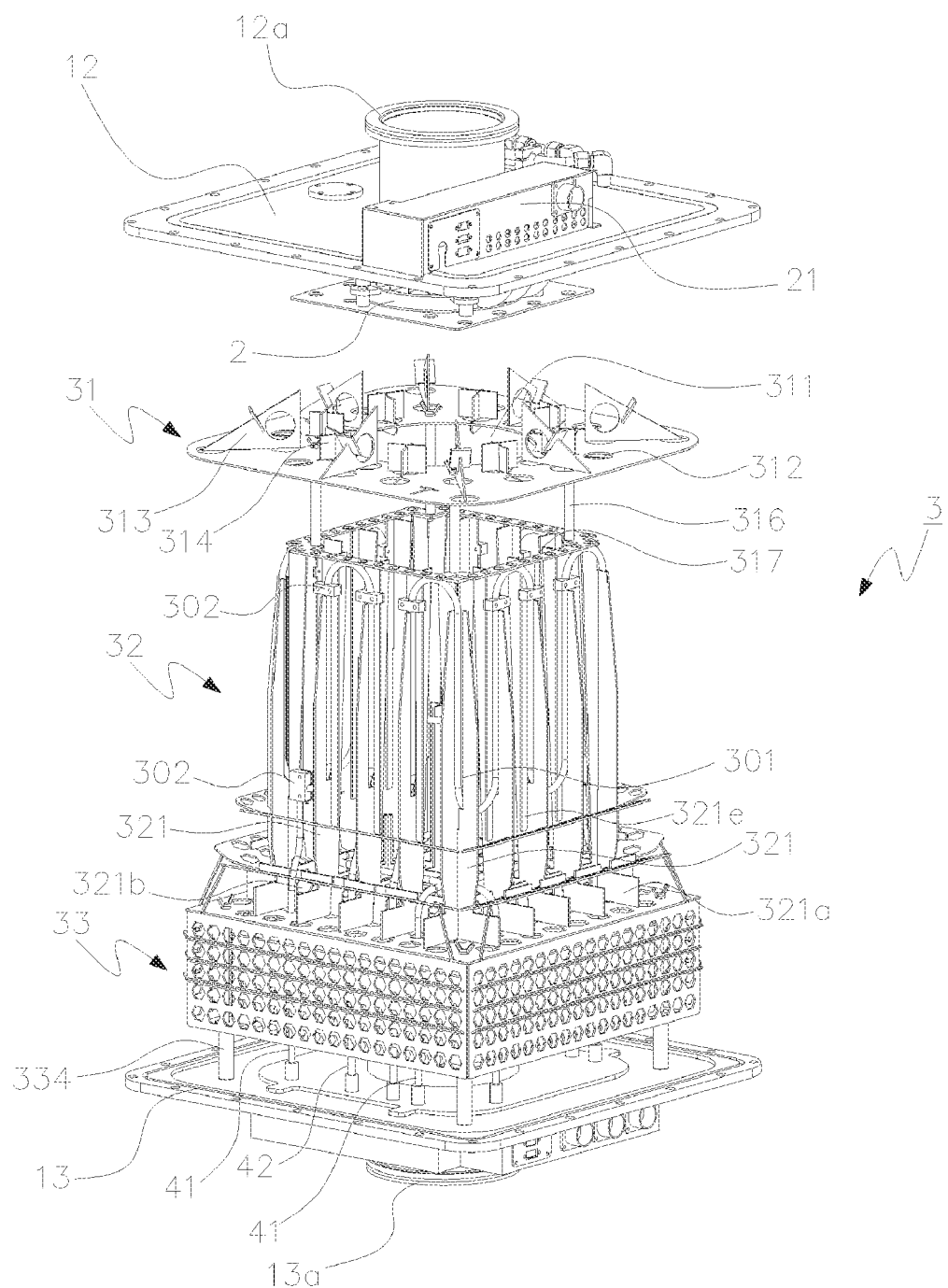
FIG. 4 is a perspective view illustrating an inner collecting tower in which the regeneration heater according to the embodiment of the present disclosure is installed.
Figure 5:
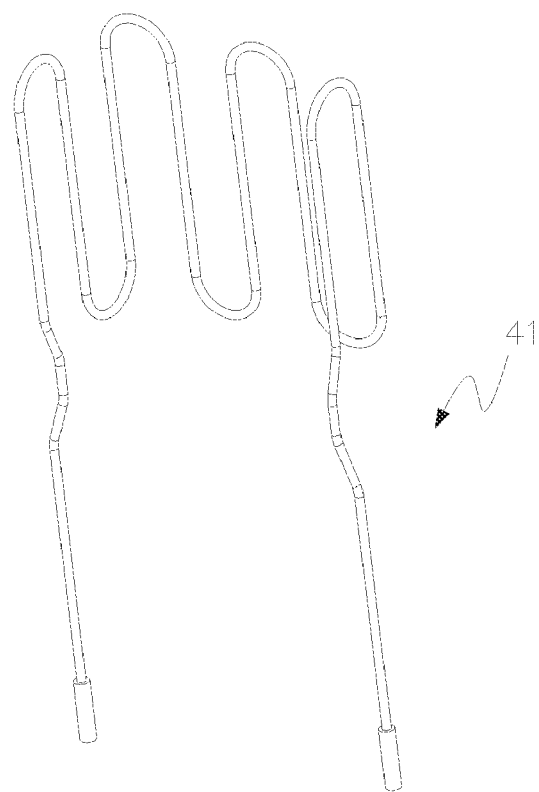
FIG. 5 is a perspective view illustrating an outer regeneration heater installed outside the inner collecting tower according to the embodiment of the present disclosure.
Figure 6:
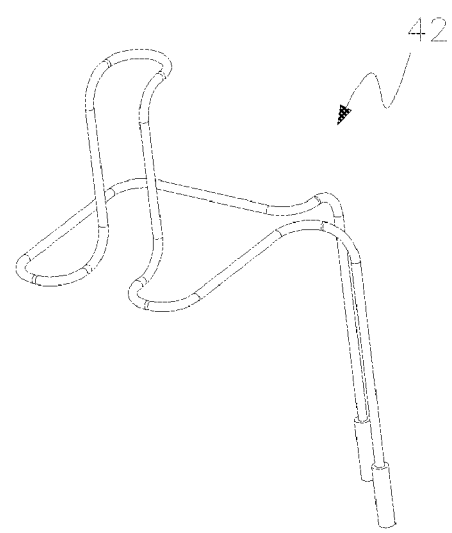
FIG. 6 is a perspective view illustrating an inner regeneration heater installed inside the inner collecting tower according to the embodiment of the present disclosure.

FIG. 1 is a cross-sectional view illustrating a configuration of a reaction by-product trapping apparatus having a regeneration heater according to an embodiment of the present disclosure, FIGS. 2 and 3 are perspective views illustrating an interior of the reaction by-product trapping apparatus having the regeneration heater according to the embodiment of the present disclosure, FIG. 4 is a perspective view illustrating an inner collecting tower in which the regeneration heater according to the embodiment of the present disclosure is installed, FIG. 5 is a perspective view illustrating an outer regeneration heater installed outside the inner collecting tower according to the embodiment of the present disclosure, and FIG. 6 is a perspective view illustrating an inner regeneration heater installed inside the inner collecting tower according to the embodiment of the present disclosure.

As illustrated, an apparatus for trapping of a reaction by-product having a self regenerating function for a used inner collecting tower according to the present disclosure includes: a housing 1 installed in a cycle for performing dry cleaning on a process chamber and a vacuum pump or the process chamber during a semiconductor manufacturing process, the housing 1 being configured to trap and discharge a reaction by-product contained in an exhaust gas discharged after a deposition process; a heater 2 configured to heat the exhaust gas introduced into the housing; an inner collecting tower 3 configured to trap the reaction by-product from the exhaust gas introduced into the housing; and regeneration heaters 4 installed in the inner collecting tower and configured to remove the reaction by-product through a heating reaction.

The trapping apparatus according to the present disclosure, which has the regeneration heaters 4 as described above, continuously performs a trapping reaction while operating. When a reaction by-product trapping reaction in the inner collecting tower installed in the trapping apparatus reaches a saturated state or a cycle for performing dry cleaning on the process chamber, the trapping apparatus stops the trapping operation and heats the inner collecting tower while performing a regeneration operation, thereby breaking and removing the reaction by-products attached to trapping plates, which constitute the inner collecting tower, or accumulated in the form of powder in the inner collecting tower and an external space. Therefore, the trapping apparatus is regenerated into a state of being capable of trapping the reaction by-product again, thereby increasing the use duration time of the trapping apparatus.

The housing 1 is configured vertically to receive and accommodate the exhaust gas discharged from the process chamber to the vacuum pump when the exhaust gas is introduced into an upper portion of the housing 1. The housing 1 is also configured to discharge the exhaust gas from a lower portion of the housing 1. The housing 1 includes a housing main body 11 configured to accommodate the introduced gas, an upper plate 12 having a gas inlet port 12a protruding upward, and a lower plate 13 having a gas discharge port 13a protruding in two upward and downward directions.

The housing main body 11 according to the embodiment of the present disclosure is illustrated as having a quadrangular column shape. However, the present disclosure is not limited only to the above-mentioned shape, and the housing main body 11 may of course have a necessary shape such as a cylindrical shape and polygonal column shape. However, for the convenience of description, the present disclosure will be described below with reference to the configuration in which the housing main body has a quadrangular column shape.

In addition, a plurality of vortex generating pieces 10a may be provided on an inner wall of the housing main body 11 and disposed at predetermined intervals in a vertical direction. The plurality of vortex generating pieces 10a generates vortices in the exhaust gas passing through the inside of the housing 1, thereby increasing the time for which the exhaust gas stays in the internal space of the housing.

In this case, a cross-sectional shape of the vortex generating piece 10a may be a flat plate shape having a horizontal shape. Alternatively, the vortex generating piece 10a may have an inclined surface made by bending an inner end of the vortex generating piece 10a upward or downward, or the vortex generating piece 10a may be rounded. The vortex generating piece having the above-mentioned shape acts as a load against a downward flow of the exhaust gas, thereby generating the vortex made by differences in directions and velocities.

The gas discharge port 13a may have a plurality of vortex generating pieces 13a' protruding along a periphery of the gas discharge port 13a that protrudes upward from the lower plate 13. When the vortex generating pieces 13a' are formed as described above, the vortex may be generated in the flow of the exhaust gas inserted into the gas discharge port and delay the time for which the reaction by-product is maximally trapped before the reaction by-product is discharged, thereby improving trapping efficiency.

The heater 2 serves as a means for heating the exhaust gas introduced into the housing and uniformly distributing the exhaust gas. Heat radiating fins 2a may be formed radially at an upper side of the heater 2 to uniformly distribute the heated exhaust gas.

In addition, a heater power supply unit 21 is installed on the upper plate 12 of the housing, supplies power to the heater 2, and measures a temperature for controlling a power supply source on the basis of an internal temperature of the housing.

The inner collecting tower 3 includes the plurality of metallic trapping plates. The inner collecting tower 3 lowers a temperature of the exhaust gas, which is in contact with or adjacent to a surface of the metallic trapping plate, while changing the flow of the exhaust gas heated again by the heater while being introduced into the housing, thereby trapping the reaction by-product, in the form of powder or a thin film, contained in the exhaust gas.

The inner collecting tower may have any shape as long as the inner collecting tower may include the plurality of metallic trapping plates and trapping only the reaction by-product in the exhaust gas.

However, according to the present disclosure, the regeneration heaters 4, which is provided to regenerate the inner collecting tower 3, is installed by regeneration heater fixing units 302 and regeneration heater through-holes 301 formed in the trapping plates to improve thermal conduction efficiency.

Since the regeneration heater through-holes 301 and the regeneration heater fixing units 302 are provided as described above, the regeneration heaters are uniformly installed on the inner collecting tower while being alternately disposed in a zigzag manner and perform a heating operation. Therefore, when the regeneration operation is started after the trapping operation is ended, the regeneration heaters regenerate the inner collecting tower by removing the reaction by-product.

The inner collecting tower 3 according to the exemplary embodiment of the present disclosure induces the flows of the introduced exhaust gas so that the flows of the introduced exhaust gas are alternately formed at a central portion and an outer periphery of the inner collecting tower 3, thereby allowing the exhaust gas to stay for a long period of time in the housing, which results in a high-efficiency trapping reaction. To this end, the inner collecting tower 3 includes: an upper-end trapping unit 31 configured to perform the trapping reaction while guiding the flow of the exhaust gas, which is distributed and descends to the outer periphery by the heater, to the central portion; an intermediate trapping unit 32 configured to perform the trapping reaction while guiding the descending flow of the exhaust gas to the outer periphery and having the regeneration heaters 4 to remove the reaction by-product; and a lower-end trapping unit 33 configured to perform the trapping reaction while guiding the exhaust gas, which descends to the outer periphery, to the gas discharge port 13a at the central portion.

The upper-end trapping unit 31 has a flat plate shape and blocks an upper-end internal space of the housing main body so that the exhaust gas, which is distributed and descends to the outer periphery from the upper heater, is guided to a main flow hole 311 formed in a central portion of the upper-end trapping unit 31 without directly descending downward, such that the exhaust gas has a main flow. A part of the exhaust gas is guided to a plurality of auxiliary flow holes 312 circularly arranged at the periphery of the main flow hole 311 and distributed to have an auxiliary flow, such that the trapping reaction is performed.

In addition, triangular plates 313, which protrude vertically, are circularly arranged at the periphery of an upper surface of the upper-end trapping unit 31 to uniformize the flow of the exhaust gas to improve trapping efficiency by inducing a uniform flow of the exhaust gas or generating vortices. Cross-shaped plates 314, which protrude vertically, are circularly arranged inside the upper-end trapping unit 31 to allow the flow of the exhaust gas to stay by generating vortices. Quadrangular plates 315, which protrude vertically, are circularly arranged on a lower surface of the upper-end trapping unit 31 to induce a uniform downward flow of the exhaust gas descending through the main flow hole 311 and the auxiliary flow holes 312. Meanwhile, the triangular plate 313 may further have vortex generating pieces to generate vortices.

In addition, the upper-end trapping unit 31 is installed to be spaced apart from the intermediate trapping unit 32 at a predetermined height by a support unit 317 and spacers 316 having a predetermined length and installed on a lower portion of the upper-end trapping unit 31. The support unit 317 is provided in the form of a band-shaped plate having a predetermined width along an upper-end shape of the intermediate trapping unit 32 so that four or more spacers are fixed to the support unit 317. The support unit 317 has a plurality of holes, such that two opposite sides thereof are fixed by screw-coupling or welding.

The intermediate trapping unit 32 includes a plurality of vertical trapping plates 321 arranged along a quadrangular periphery and spaced apart from one another at predetermined intervals to guide the exhaust gas to the outer periphery after the reaction by-product is trapped from the exhaust gas introduced into the central portion from the upper-end trapping unit 31.

The intermediate trapping unit 32 will be described in more detail. The plurality of vertical trapping plates 321 is arranged to be spaced apart from one another at predetermined intervals along the quadrangular periphery, and one or more vertical trapping plates having a relatively small size are also installed in the internal space.

With this shape, when the exhaust gas, which is guided and descends from above, is accommodated in the internal space of the intermediate trapping unit 32, the exhaust gas comes into contact with or adjoins the respective vertical trapping plates 321 while flowing in a direction from upper surfaces to lower surfaces of the respective vertical trapping plates 321 arranged along the periphery so as to be spaced apart from one another at predetermined intervals, such that the reaction by-product contained in the exhaust gas is trapped and the exhaust gas is discharged in a direction toward the outer periphery.

In this case, the exhaust gas, which descends from the auxiliary flow holes 312 of the upper-end trapping unit 31, also comes into contact with and adjoins outer sides of the respective vertical trapping plates 321, such that the reaction by-product is trapped.

The exhaust gas, which is guided in the direction from the inside of the intermediate trapping unit 32 to the outer periphery, consistently flows into the central portion of the intermediate trapping unit 32 from the upper-end trapping unit 31 disposed above the intermediate trapping unit 32.

Therefore, the main flow is mainly formed at the lower side because of the flow of the descending exhaust gas.

In one embodiment, a single quadrangular column type intermediate trapping unit 32 may be made by fitting-combining, in a lattice shape, a configuration in which the vertical trapping plate 321 includes vertical trapping plates 321*c* each having a large vertical size and symmetrically formed at two opposite ends of a lower-end horizontal plate 321*a* having a plurality of flow holes 321*b* formed at a lower end thereof and a configuration in which the vertical trapping plates 321 each having a large vertical size are symmetrically formed at two opposite ends of the lower-end plate having a plurality of flow holes formed at a lower end thereof and a vertical trapping plate 321*d* having a relatively small vertical size is formed at the central portion.

In addition, vertical auxiliary trapping plates 321*e* are formed on a surface of the vertical trapping plate 321 having a large vertical size and formed at the outer periphery and protrude perpendicularly to two opposite sides of the vertical trapping plate 321, so that the vertical trapping plate 321 has a cross-shaped cross-section, thereby increasing a trapping cross-section.

Since the cross-shaped cross-sectional shape is formed as described above, a trapping area increases, and vortices are formed in the flow of the exhaust gas, such that the flow of the exhaust gas is delayed and the trapping reaction time increases.

Meanwhile, in the vertical trapping plates 321 that constitute the intermediate trapping unit 32 and are arranged at predetermined intervals along the periphery, the regeneration heater through-holes 301 are formed to be penetrated by the regeneration heaters 4, and the regeneration heater fixing units 302 are installed to fix the regeneration heaters 4 while connecting the adjacent vertical trapping plates.

The lower-end trapping unit 33 includes an outer peripheral trapping plate part 331 having a plurality of flow holes formed in a surface thereof, an intermediate trapping plate part 332 each having a plurality of flow holes formed in a surface thereof, and an inner trapping plate part 333 each having a plurality of flow holes formed in a surface thereof to guide the flow of the exhaust gas in order to perform the trapping reaction while guiding the exhaust gas inward from the outer periphery, blocking the inflow of the exhaust gas from above so that the exhaust gas in the intermediate trapping unit 32 does not flow directly into the gas discharge port 13*a*, and then allowing the exhaust gas to flow into the upper side of the gas discharge port 13*a* protruding upward from the central portion of the lower plate of the housing and then descends.

In this case, the lower-end trapping unit 33 is fastened to supports 334 installed on the lower plate of the housing, and the lower-end trapping unit 33 is spaced apart from the lower plate of the housing. In this state, the supports 334 support an overall load of the intermediate trapping unit 32, thereby allowing a smooth inflow of the exhaust gas.

The outer peripheral trapping plate part 331, the intermediate trapping plate part 332, and the inner trapping plate part 333, which are configured as multiple plate parts, may each have a lower end that becomes closer to the lower plate of the housing in a direction from the outer peripheral trapping plate part 331 to the inner trapping plate part 333 so that the introduced exhaust gas sequentially flows in.

Specifically, in one embodiment, the outer peripheral trapping plate part 331 has a quadrangular column structure (a cylindrical shape or a polygonal column shape may be applied) opened at a lower side thereof and includes an upper trapping plate and lateral trapping plates that have a plurality of flow holes equal in size to one another. In this case, a plurality of vortex generating pieces 331*a* is installed and arranged on outer portions of lateral surfaces of the outer peripheral trapping plate part 331 and each inclined upward at an inclination angle in an outward direction. The plurality of vortex generating pieces 331*a* may be configured to improve trapping efficiency by guiding the flow of the exhaust gas and generating vortices.

In addition, the intermediate trapping plate part 332 has a quadrangular column structure (a cylindrical shape or a polygonal column shape may be applied) opened at a lower side thereof. The intermediate trapping plate part 332 is spaced apart from the upper surface of the outer peripheral trapping plate part 331 at a predetermined interval by spacers 332*a* and includes an upper trapping plate and lateral trapping plates. The upper trapping plate has a closed structure. Each of the lateral trapping plates has a plurality of flow holes, the lower hole is large, and the upper hole is small, such that a main flow of the exhaust gas may be formed downward. In this case, the hole formed in the intermediate trapping plate part 332 may be smaller than the hole formed in the outer peripheral trapping plate part 331, thereby enabling a smooth flow of the exhaust gas and a smooth trapping reaction.

In addition, the inner trapping plate part 333 has a quadrangular column structure (a cylindrical shape or a polygonal column shape may be applied) opened at upper and lower sides thereof. The inner trapping plate part 333 is fastened and fixed to the intermediate trapping plate part by welding or the like and includes lateral trapping plates having a plurality of flow holes. The lower hole is large, and the upper hole is small, such that a main flow of the exhaust gas may be formed downward. In this case, the hole formed in the inner trapping plate part 333 may be smaller than the hole formed in the outer peripheral trapping plate part 331, thereby enabling a smooth flow of the exhaust gas and a smooth trapping reaction.

When the inner collecting tower 3 and the space portion at the periphery thereof are fully filled with the reaction by-products by the trapping reaction or a cycle for performing dry cleaning on the process chamber is reached, the regeneration heater 4 removes the reaction by-products accumulated in the inner collecting tower and the periphery thereof by heating, breaking, and detaching the reaction by-products or collapses the reaction by-products so that the reaction by-products are accumulated at the lower side and an overall volume of the reaction by-products is reduced. Therefore, an additional trapping reaction space is ensured to allow an additional trapping reaction to be performed again, thereby extending the use duration time.

To this end, the regeneration heaters 4 have a combination of curved pipes and general pipes alternately disposed in a zigzag manner in the inner collecting tower 3, such that thermal conduction may be implemented. In this case, the pipes may be installed not only alternately upward and downward in a zigzag manner, but also alternately leftward and rightward in a zigzag manner.

Specifically, in one embodiment, the regeneration heaters 4 may be alternately installed in a zigzag manner by the regeneration heater fixing units 302 and the regeneration heater through-holes 301 formed in the vertical trapping plates 321 that constitute the intermediate trapping unit 32. In this case, the regeneration heaters may be installed not only alternately upward and downward in a zigzag manner, but also alternately leftward and rightward in a zigzag manner.

Since the regeneration heaters are installed alternately upward and downward in a zigzag manner while surrounding the inner collecting tower as described above, temperatures of the regeneration heaters are quickly raised by an excellent thermal conduction effect of a metallic material and reach a detachment temperature at which the reaction by-product is detached from the metallic material. The reaction by-product is detached from the metallic trapping plate on the principle that the reaction by-product adhering hard to the trapping plate is detached from a surface, to which the reaction by-product is initially attached, by being dried, shrunk, and broken under a temperature condition of a high temperature higher than a temperature of a condition during the trapping reaction.

In one embodiment, the regeneration heaters 4 may include an outer regeneration heater 41 installed outside the inner collecting tower 3 and having a combination of a curved pipe and a general pipe, and an inner regeneration heater 42 installed inside the inner collecting tower 3 and having a combination of a curved pipe and a general pipe.

With this configuration, the reaction by-products formed on the surfaces of the trapping plates and the periphery of the trapping plates disposed at the periphery of the intermediate trapping unit 32 constituting the inner collecting tower 3 are quickly removed, and the reaction by-products accumulated on the surfaces of the trapping plates disposed in the internal space and accumulated in the peripheral space are also simultaneously and quickly removed.

The outer regeneration heater 41 and the inner regeneration heater 42 receive power from a single power supply unit installed outside the trapping apparatus or receive power from power supply units separately provided. In this case, a lower portion of the outer regeneration heater and a lower portion of the inner regeneration heater penetrate the lower plate of the housing, and a power line provided in the outer regeneration heater and a power line provided in the inner regeneration heater are connected to the outside. In addition, the heater power supply unit 21 may be used as the power supply unit or a separate power supply unit dedicated for the regeneration heater may be used as the heater power supply unit 21.

The single outer regeneration heater 41 may be configured to surround the outer portion of the inner collecting tower, or the outer regeneration heater 41 may be divided into two or more pieces for the convenience of installation.

Likewise, the single inner regeneration heater 42 may be configured to be installed in the inner collecting tower, or the inner regeneration heater 42 may be divided into two or more pieces for the convenience of installation.

The outer regeneration heaters 41 are installed alternately in a zigzag manner by the regeneration heater fixing units 302 and the regeneration heater through-holes 301 formed in the vertical trapping plates 321 arranged to be spaced apart from one another at predetermined intervals along the periphery constituting the intermediate trapping unit 32.

The inner regeneration heater is installed to pass through the periphery of the vertical trapping plate 321 so as to be in contact with or adjacent to the vertical trapping plate 321 installed in the internal space constituting the intermediate trapping unit 32. That is, it is acceptable if a size of the vertical trapping plate 321 disposed in the space portion of the central portion is smaller than a size of the vertical trapping plate 321 disposed at the periphery and the plurality of vertical trapping plates 321 is not provided in the space portion of the central portion, so that the thermal conduction is implemented.

Figure 7:
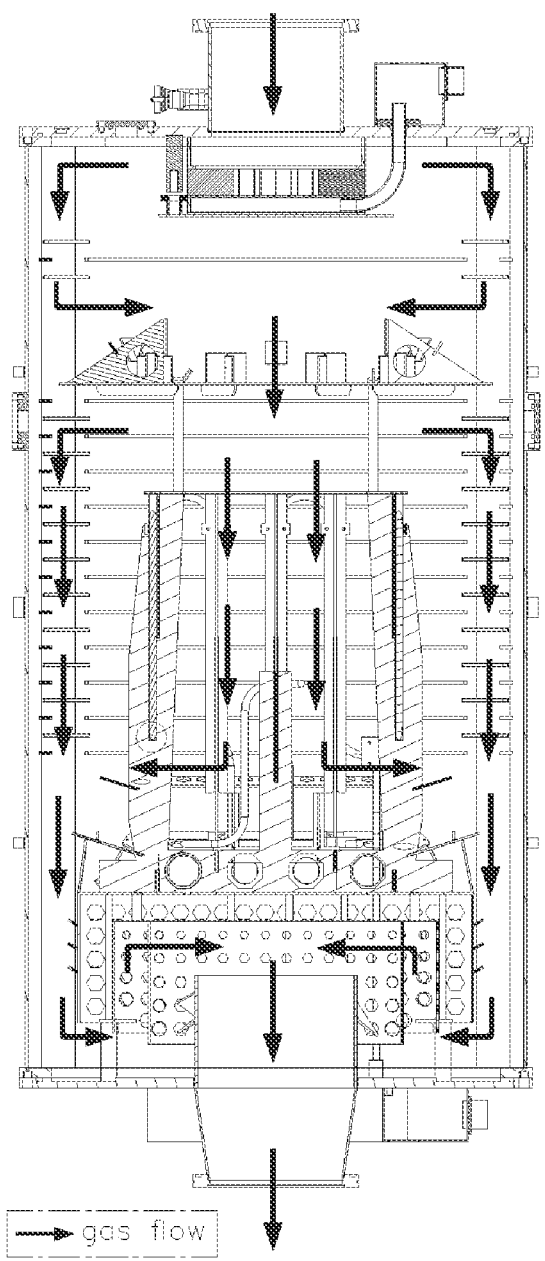
FIG. 7 is an exemplified view illustrating a gas flow in the reaction by-product trapping apparatus according to the embodiment of the present disclosure.
Figure 8:
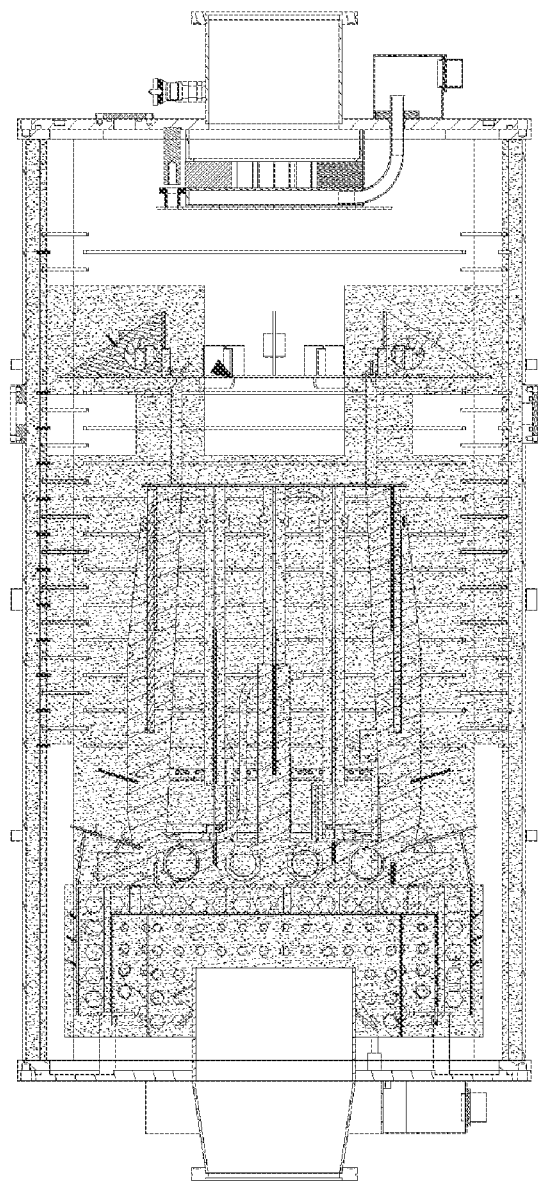
FIG. 8 is an exemplified view illustrating a primary trapping tendency in the reaction by-product trapping apparatus according to the embodiment of the present disclosure.
Figure 9:
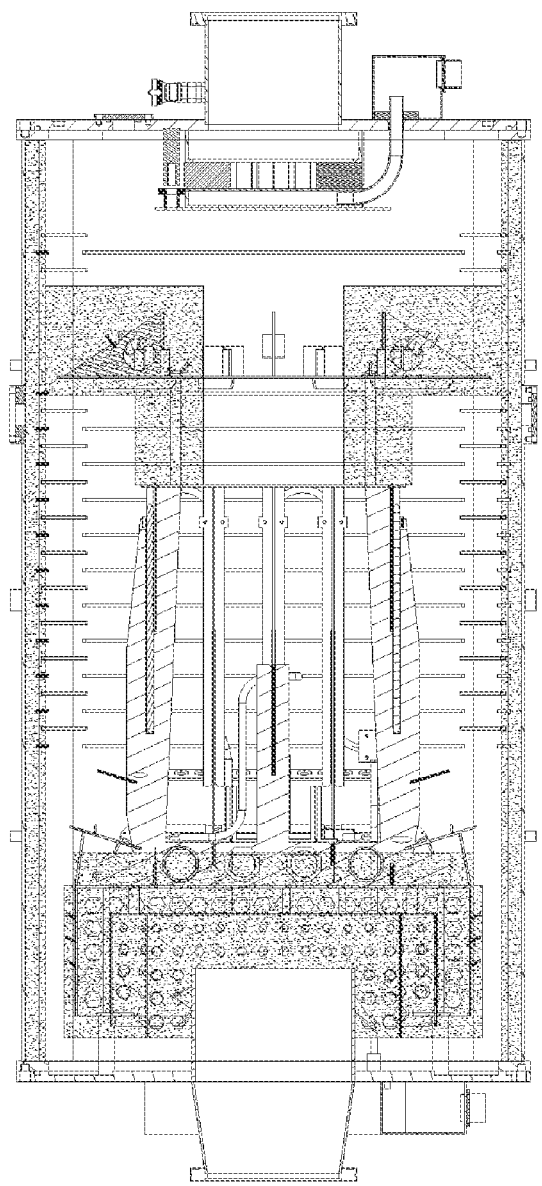
FIG. 9 is an exemplified view illustrating a trapping region in the reaction by-product trapping apparatus which is ensured by a regeneration process according to the embodiment of the present disclosure.
Figure 10:
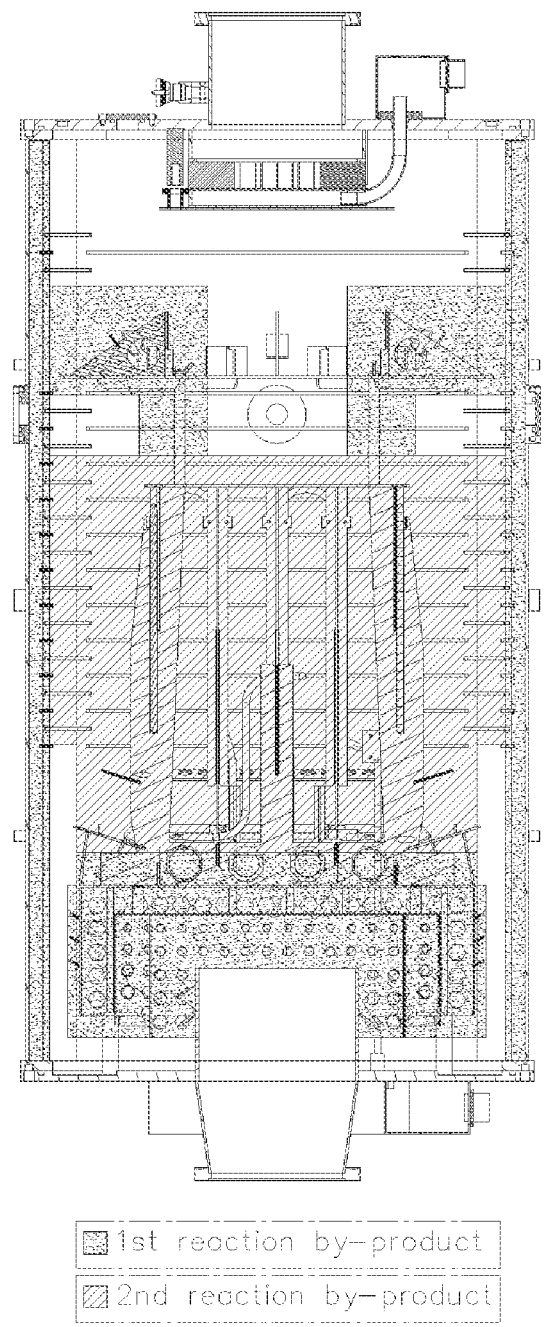
FIG. 10 is an exemplified view illustrating a second trapping tendency after an additional trapping reaction in the reaction by-product trapping apparatus according to the embodiment of the present disclosure.

FIG. 7 is an exemplified view illustrating a gas flow in the reaction by-product trapping apparatus according to the embodiment of the present disclosure, FIG. 8 is an exemplified view illustrating a primary trapping tendency in the reaction by-product trapping apparatus according to the embodiment of the present disclosure, FIG. 9 is an exemplified view illustrating a trapping region in the reaction by-product trapping apparatus which is ensured by a regeneration process according to the embodiment of the present disclosure; and FIG. 10 is an exemplified view illustrating a second trapping tendency after an additional trapping reaction in the reaction by-product trapping apparatus according to the embodiment of the present disclosure.

Temperature conditions during the trapping reaction of trapping the reaction by-product in the exhaust gas and the regeneration reaction of removing the reaction by-product by using the inner collecting tower and the regeneration heaters according to the present disclosure configured as described above will be described below.

First, in one embodiment, the flow of the exhaust gas is heated by the heater 2, the exhaust gas introduced into the outer periphery inside the housing flows into the central portion by the upper-end trapping unit 31 of the inner collecting tower 3, flows along the outer periphery again by the intermediate trapping unit 32, flows into the central portion of the housing again by the lower-end trapping unit 33, flows into the upper end of the gas discharge port 13a, and then flows downward.

In a case in which the trapping apparatus according to the present disclosure is configured as a trapping apparatus configured to trap particulate reaction by-products contained in the exhaust gas produced during a titanium nitride (TiN) deposition process using $TiCl_4$ and $NH_3$ gases in the process chamber, the trapping reaction occurs in the flow of the exhaust gas as described above. A reaction by-product trapping reaction temperature of each of the trapping plates constituting the inner collecting tower 3 is set within a temperature region of 120° C. or less by the heater power supply unit 21, such that a primary trapping reaction occurs as the trapping reaction occurs.

When the reaction by-product trapping reaction in the inner collecting tower reaches a saturated state under the above-mentioned condition, the reaction by-products are attached or accumulated in the housing, and the normal reaction by-product trapping reaction cannot be performed any further, such that the trapping operation is stopped, as illustrated in FIG. 8.

Thereafter, the regeneration reaction is started. In the case of the substances of the exhaust gas according to the embodiment of the present disclosure, the inner collecting tower 3 is heated to 400° C. or higher which is higher than the trapping reaction temperature in order to break and detach the reaction by-products from the inner collecting tower 3.

When the heating operation is started and the temperature reaches a temperature as high as 400° C. higher than a temperature during the trapping reaction, the temperature reaches a reaction starting temperature, and the regeneration reaction is started. The state of the reaction by-products, which are attached to or accumulated on the surfaces of the trapping plates constituting the inner collecting tower or accumulated in the internal and external spaces, begins to be changed from a hard state to a broken state. Thereafter, when the temperature reaches 550 to 600° C., the regeneration reaction maximally occurs, and most of the reaction by-products are broken and accumulated in the lower space, such that new trapping spaces are defined inside and outside the inner collecting tower, as illustrated in FIG. 9.

Thereafter, the operation of the regeneration heater is stopped, and the regeneration reaction is ended.

Thereafter, when the temperature in the housing is set within a temperature region of 120° C. or lower by the heater power supply unit 21, the trapping reaction occurs again, such that a secondary trapping reaction occurs. When the additional trapping reaction occurs as described above, the reaction by-products are attached or accumulated in the spaces inside and outside the inner collecting tower, which are ensured as illustrated in FIG. 9, such that a state illustrated in FIG. 10 is made.

In this state, the regeneration reaction may be started again. However, the trapping apparatus, which has performed the regeneration operation once, may be replaced with a new trapping apparatus, and the interior of the replaced trapping apparatus may be subjected to a cleaning process.

The temperature condition, which has been described above in one embodiment, may vary depending on process gases used for the deposition process performed in the process chamber. However, the configuration in which the temperature is adjusted so that the temperature applied to the regeneration reaction of removing the reaction by-product is higher than the temperature applied to the trapping reaction is equally applied.

The present disclosure is not limited to the specific exemplary embodiment described above, various modifications can be made by any person skilled in the art to which the present disclosure pertains without departing from the subject matter of the present disclosure as claimed in the claims, and the modifications are within the scope defined by the claims.

What is claimed is:

1. An apparatus for trapping of a reaction by-product having a self regenerating function for a used inner collecting tower, which is installed between a process chamber and a vacuum pump or between the vacuum pump and a scrubber during a semiconductor manufacturing process, the apparatus comprising:
   a heater (2) configured to heat exhaust gas introduced into a housing (1) to trap and discharge a reaction by-product contained in the exhaust gas discharged after a deposition process;
   an inner collecting tower (3) configured to trap the reaction by-product from the exhaust gas introduced into the housing; and
   regeneration heaters (4) installed on the inner collecting tower (3) and configured to remove the reaction by-product through a heating reaction,
   wherein spaces inside and outside the inner collecting tower (3) are ensured so that an additional trapping reaction occurs.

2. The apparatus of claim 1, wherein the regeneration heaters (4) are installed alternately in a zigzag manner on the inner collecting tower (3) so that thermal conduction is implemented.

3. The apparatus of claim 2, wherein the regeneration heaters (4) comprise:
   an outer regeneration heater (41) installed to be in contact with or adjacent to an outer portion of the inner collecting tower (3); and
   an inner regeneration heater (42) installed in an internal space of the inner collecting tower (3).

4. The apparatus of claim 1, wherein the regeneration heaters (4) comprise:
   an outer regeneration heater (41) installed to be in contact with or adjacent to an outer portion of the inner collecting tower (3); and
   an inner regeneration heater (42) installed in an internal space of the inner collecting tower (3).

5. The apparatus of claim 4, wherein the single outer regeneration heater (41) is provided, or the outer regeneration heater (41) is divided into two or more pieces to surround the outer portion of the inner collecting tower.

6. The apparatus of claim 4, wherein the single inner regeneration heaters (42) is provided, or the inner regeneration heater (42) is divided into two or more pieces to surround the outer portion of the inner collecting tower.

7. The apparatus of claim 1, wherein the reaction by-product trapping apparatus is a trapping apparatus configured to trap the reaction by-product contained in the exhaust gas produced during a TiN deposition process using $TiCl_4$ and $NH_3$ gases in the process chamber,
   wherein the reaction by-product trapping apparatus traps the reaction by-product in the exhaust gas by using the inner collecting tower (3) by heating an internal space of the housing to a temperature within a temperature region of 120° C. or lower by using the heater (2), and
   wherein the reaction by-product trapping apparatus ensures an additional trapping reaction space through a regeneration operation of removing the reaction by-product inside and outside the inner collecting tower (3) by heating the regeneration heater (4) to 400° C. or higher when the trapping reaction is ended.

8. The apparatus of claim 1, wherein the inner collecting tower (3) comprises:
   an upper-end trapping unit (31) configured to perform the trapping reaction while guiding a flow of the exhaust gas, which is distributed and descending to an outer periphery by the heater, to a central portion;
   an intermediate trapping unit (32) configured to perform the trapping reaction while guiding the flow of the descending exhaust gas to the outer periphery and having the regeneration heaters (4) to remove the reaction by-product; and
   a lower-end trapping unit (33) configured to perform the trapping reaction while guiding the exhaust gas descending to the outer periphery to a gas discharge port (13a) at the central portion.

9. The apparatus of claim 8, wherein the upper-end trapping unit (31) has a flat plate shape, a main flow hole (311) is formed in a central portion of the upper-end trapping unit (31), a plurality of auxiliary flow holes (312) is formed to be circularly arranged at the periphery of the main flow hole (311), triangular plates (313) for inducing an exhaust gas flow and cross-shaped plates (314) for generating vortices are circularly arranged at the periphery of an upper surface of the upper-end trapping unit (31), and quadrangular plates (315) are circularly arranged on a lower surface of the upper-end trapping unit (31) to induce a uniform downward flow of the exhaust gas descending through the main flow hole (311) and the auxiliary flow holes (312).

10. The apparatus of claim 9, wherein the upper-end trapping unit (31) is installed to be spaced apart from the intermediate trapping unit (32) at a predetermined height by a support unit (317) and spacers (316) installed on a lower portion of the upper-end trapping unit (31) and having a predetermined length.

11. The apparatus of claim 8, wherein the upper-end trapping unit (31) is installed to be spaced apart from the intermediate trapping unit (32) at a predetermined height by a support unit (317) and spacers (316) installed on a lower portion of the upper-end trapping unit (31) and having a predetermined length.

12. The apparatus of claim 8, wherein the intermediate trapping unit (32) comprises a plurality of vertical trapping plates (321) arranged to be spaced apart from one another at predetermined intervals, regeneration heater through-holes (301) are formed in the vertical trapping plates (321) and penetrated by the regeneration heaters (4), and regeneration heater fixing units (302) are installed to connect the adjacent vertical trapping plates and fix the regeneration heaters (4).

13. The apparatus of claim 12, wherein the intermediate trapping unit (32) comprises vertical trapping plates (321d) installed in an internal space thereof, and the vertical trapping plates (321d) each have a relatively smaller size than each of a plurality of vertical trapping plates (321c) arranged to be spaced apart from one another at predetermined intervals along the periphery of the intermediate trapping unit (32), such that thermal conduction is implemented from the regeneration heaters (4).

14. The apparatus of claim 8, wherein the intermediate trapping unit (32) comprises an outer peripheral trapping plate part (331), an intermediate trapping plate part (332), and an inner trapping plate part (333), which are configured as multiple plate parts and each have flow holes formed in a surface thereof,
wherein the intermediate trapping unit (32) is configured to perform the trapping reaction while guiding the exhaust gas inward from the outer periphery and blocking an inflow of the exhaust gas from above so that the exhaust gas does not flow directly into the gas discharge port (13a), and
wherein the intermediate trapping unit (32) is fastened to supports (334) installed on a lower plate of the housing, and the supports (334) are configured to support an overall load of the intermediate trapping unit (32) in a state in which the intermediate trapping unit (32) is spaced apart from the lower plate of the housing.

15. The apparatus of claim 14, wherein the outer peripheral trapping plate part (331) has a structure opened at a lower side thereof and comprises an upper trapping plate and lateral trapping plates each having a plurality of flow holes, and a plurality of vortex generating pieces (331a) is arranged and installed at an inclination angle on an outer portion of the outer peripheral trapping plate part (331).

16. The apparatus of claim 14, wherein the intermediate trapping plate part (332) has a structure opened at a lower side thereof and spaced apart from an upper surface of the outer peripheral trapping plate part (331) at a predetermined interval by spacers (332a), and the intermediate trapping plate part (332) comprises an upper trapping plate having a closed structure, and lateral trapping plates having a plurality of flow holes.

17. The apparatus of claim 14, wherein the inner trapping plate part (333) has a structure opened at upper and lower sides thereof and is fixed to the intermediate trapping plate part, and the inner trapping plate part (333) comprises lateral trapping plates having a plurality of flow holes.

* * * * *